United States Patent
Liu et al.

(10) Patent No.: US 8,625,288 B1
(45) Date of Patent: Jan. 7, 2014

(54) SERVER CABINET

(71) Applicants: Ming-Yu Liu, Shenzhen (CN);
An-Gang Liang, Shenzhen (CN)

(72) Inventors: Ming-Yu Liu, Shenzhen (CN);
An-Gang Liang, Shenzhen (CN)

(73) Assignees: Hong Fu Jin Precision Industry
(ShenZhen) Co., Ltd., Shenzhen (CN);
Hon Hai Precision Industry Co., Ltd.,
New Taipei (TW)

(*) Notice: Subject to any disclaimer, the term of this patent is extended or adjusted under 35 U.S.C. 154(b) by 0 days.

(21) Appl. No.: 13/629,502

(22) Filed: Sep. 27, 2012

(30) Foreign Application Priority Data

Aug. 30, 2012 (CN) .................. 2012 1 03144871

(51) Int. Cl.
*H05K 7/16* (2006.01)
(52) U.S. Cl.
USPC ........... 361/727; 361/724; 361/725; 361/726; 361/756; 361/741
(58) Field of Classification Search
USPC ............. 361/679.01, 679.02, 679.31, 679.32, 361/679.49, 715, 724–727, 796, 797, 800, 361/801, 802, 825, 816, 756, 741, 686; 174/542; 312/236, 223.2
See application file for complete search history.

(56) References Cited

U.S. PATENT DOCUMENTS

| | | | | |
|---|---|---|---|---|
| 6,560,114 B2 * | 5/2003 | Berry et al. | ................... | 361/727 |
| 7,401,756 B2 * | 7/2008 | Lien et al. | ................ | 248/346.07 |
| 8,363,414 B2 * | 1/2013 | Peng et al. | .................... | 361/724 |
| 8,441,788 B2 * | 5/2013 | Xu | ............................ | 361/679.46 |
| 8,472,183 B1 * | 6/2013 | Ross et al. | ................. | 361/679.5 |
| 2004/0027808 A1 * | 2/2004 | Rumney | ......................... | 361/724 |

\* cited by examiner

*Primary Examiner* — Hoa C Nguyen
*Assistant Examiner* — Christopher L Augustin
(74) *Attorney, Agent, or Firm* — Altis Law Group, Inc.

(57) ABSTRACT

A server cabinet includes a rack, a server installed in the rack and defining an opening, and a shield apparatus. The removable shield apparatus includes a bracket mounted in the rack above the server, and a first shield plate slidably installed to the bracket for shielding the opening of the server to guide and restrict the passage of a cooling airflow.

8 Claims, 5 Drawing Sheets

SERVER CABINET

BACKGROUND

1. Technical Field

The disclosure relates to server cabinets and, particularly, to a server cabinet with a shield apparatus.

2. Description of Related Art

Server cabinets include a plurality of stacked servers and a switch mounted on a top of the server cabinet. A top of each server is exposed, and a bottom wall of each server shields the top of the next server down. However, a bottom wall of the switch is lower than the top of the topmost server. Thus, the top surface of the topmost server cannot be completely shielded by the bottom wall of the switch. Airflows from the interior of the topmost server may flow out of the topmost server, which decreases heat dissipation efficiency in the topmost server cabinet.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
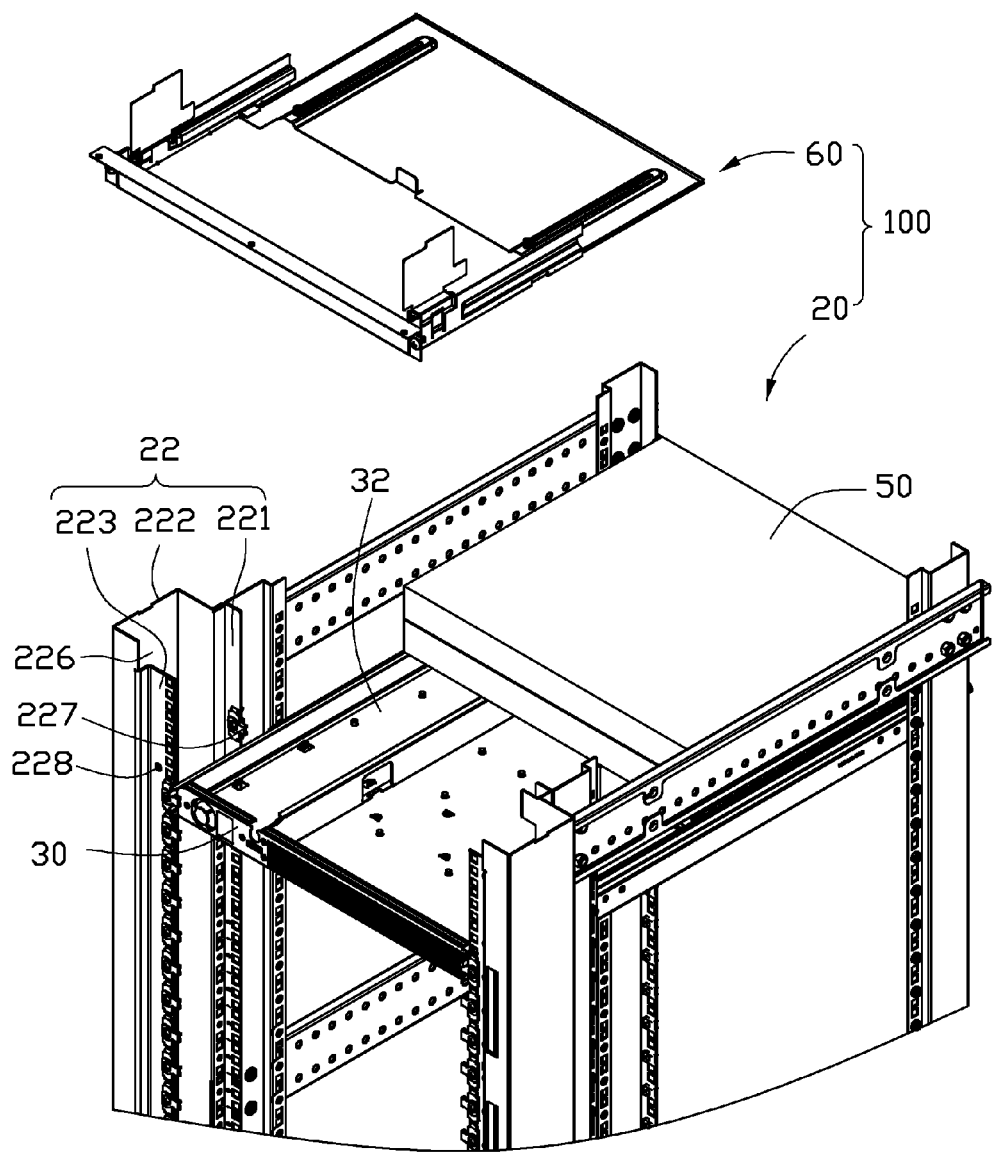
FIG. 1 is a partial, exploded, and isometric view of an embodiment of a server cabinet, wherein the server cabinet includes a shield apparatus.

FIG. 1 shows an embodiment of a server cabinet 100. The server cabinet 100 includes a rectangular rack 20, a server 30 installed in the rack 20, a switch 50 received in the rack 20 and located above the server 30, and a shield apparatus 60.

The rack 20 includes four support poles 22 respectively located at four corners of the rack 20. Each support pole 22 at a rear end of the rack 20 includes a rectangular support bar 222, a first side plate 221 extending inwards from a first side of the support bar 222, and a second side plate 223 extending inwards from a second side of the support bar 22 opposite to the first side plate 221. The support bar 222, the first side plate 221, and the second side plate 223 cooperatively bound a space 226. A guiding block 227 protrudes in from the first side plate 221 and is located above the server 30. The second side plate 223 defines a screw hole 228 located above the guiding block 227. A plurality of fans (not shown) is installed in the rack 20 for creating heat-dissipating airflows.

The top of the server 30 defines an opening 32. A bottom wall of the switch 50 shields a front portion of the opening 32 of the server 30.

Figure 2:
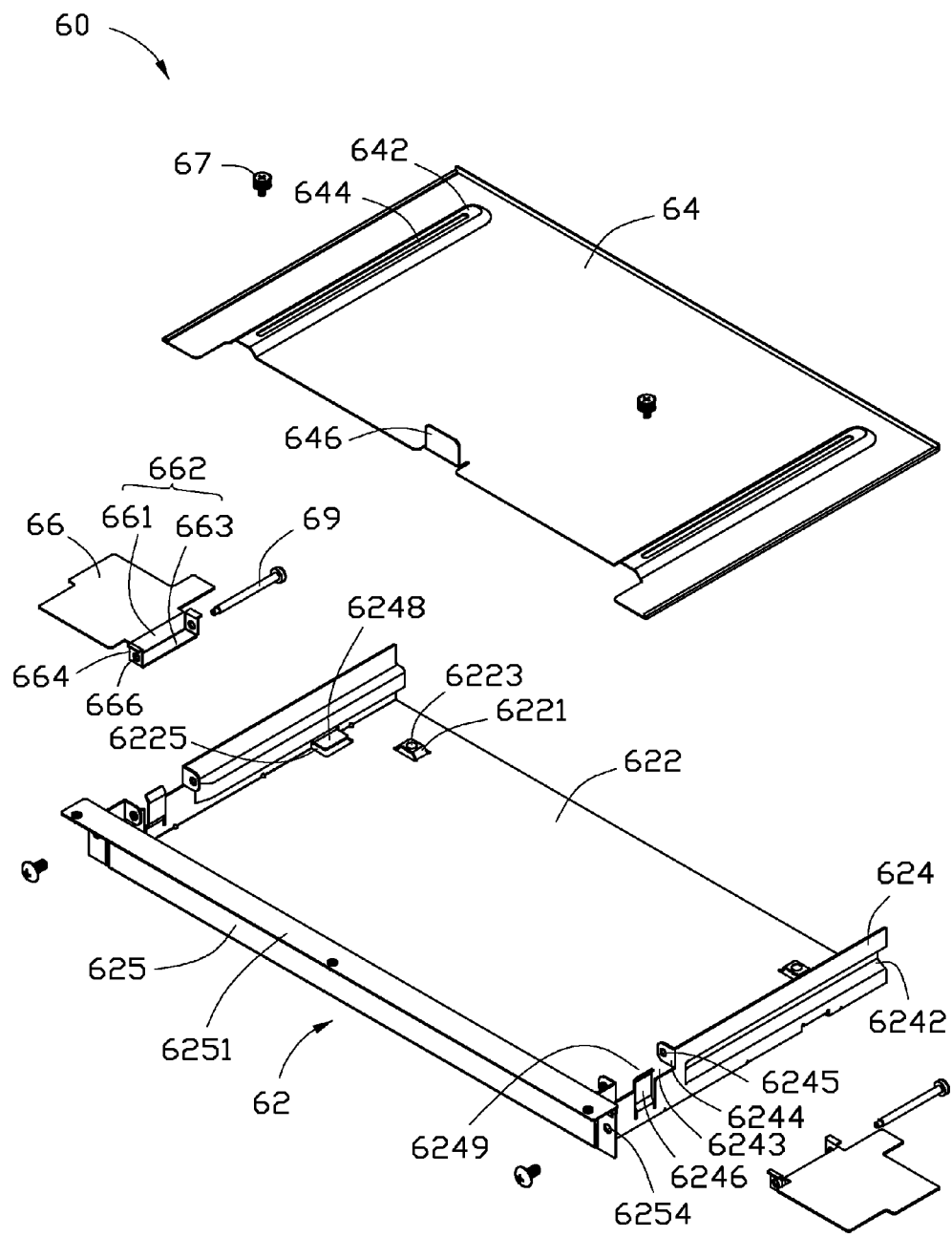
FIG. 2 is an exploded, isometric view of the shield apparatus of FIG. 1.

Referring to FIG. 2, the shield apparatus 60 includes a bracket 62, a first shield plate 64, two second shield plates 66, two screws 67, and two shafts 69.

The bracket 62 includes a rectangular support plate 622, two end plates 624 perpendicularly extending up from opposite ends of the support plate 622, and a fastening plate 625 extending up from a first side of the support plate 622. A flange 6251 protrudes from a top side of the fastening plate 625. A protrusion 6221 protrudes from each of the two ends of a second side of the support plate 622 opposite to the fastening plate 625. Each protrusion 6221 defines a screw hole 6223. Each end plate 624 defines a slide slot 6242 extending lengthways along the end plate 624. Each slide slot 6242 extends through an end of the end plate 624 adjacent to the second side of the support plate 622. Each end plate 624 defines a cutout 6243 located between the fastening plate 625 and the slide slots 6242, the two cutouts 6243 directly oppose each other. Tabs 6244 perpendicularly extend in from two opposite sidewalls bounding the cutout 6243 of each end plate 624, and aligned and opposing shaft holes 6245 are defined in the tabs 6244. A resilient piece 6246 extends up into the cutout 6243 from each end plate 624. The tabs 6244 and the resilient piece 6243 of each end plate 624 cooperatively bound a receiving space 6249. A position piece 6248 extends in from each end plate 624 adjacent to the protrusion 6221 and is parallel to the support plate 622. The position piece 6248 and the support plate 622 cooperatively bound a guiding slot 6225. Each of the two ends of the fastening plate 625 defines a through hole 6254.

The first shield plate 64 is substantially rectangular, two parallel guiding rails 642 protrude up from opposite ends of the shield plate 64. Each guiding rail 642 extends front to back across the shield plate 64 and through a rear edge of the shield plate 64. A top surface of each guiding rail 642 defines a slide slot 644 extending lengthwise along the guiding rail 642. An operation piece 646 protrudes up from the side of the shield plate 64, between the guiding rails 642.

Each second shield plate 66 is configured to be received in the space 226. A substantially L-shaped extending portion 662 is formed at a side of the second shield plate 66. The extending portion 662 includes a first position plate 661 perpendicularly extending down from the second shield plate 66, a second position plate 663 perpendicularly extending from a distal side of the first position plate 661 away from the second shield plate 66, and two connecting pieces 664 extending from opposite ends of the first position plate 661 and connected to opposite ends of the second position plate 663. The connecting pieces 664 define opposing through holes 666.

In the embodiment, each shaft 69 is a bolt.

Figure 3:
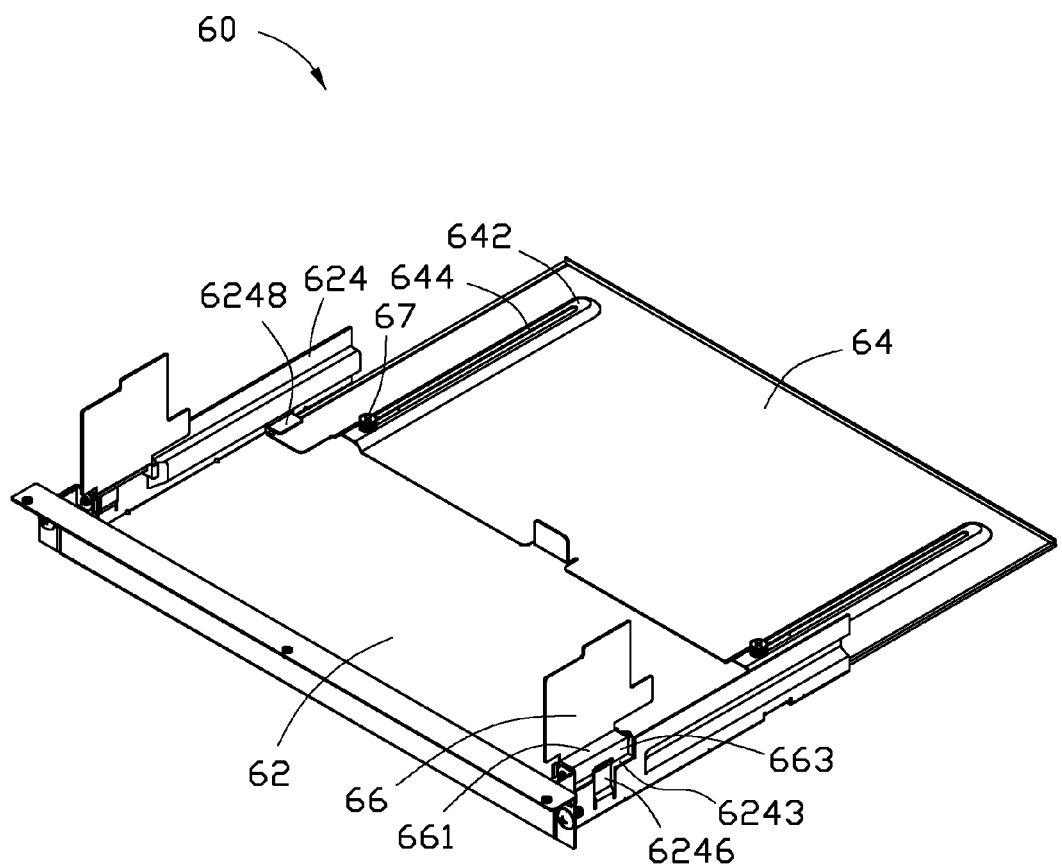
FIG. 3 is an assembled, isometric view of the shield apparatus of FIG. 2.

Referring to FIG. 3, in assembly of the shield apparatus 60, the edge or end of the first shield plate 64 which carries the operation piece 646 is inserted into the guiding slot 6225 of the bracket 62. The protrusions 6221 are slidably received in the guiding rails 642. The screw hole 6223 of each protrusion 6221 aligns with the slide slot 644 of the guiding rail 642. Screws 67 extend through the slide slots 644, to be screwed into the screw holes 6223. Thereby, the first shield plate 64 is slidably mounted to the bracket 62. The extending portions 662 of the second shield plates 66 are received in the receiving spaces 6249 of the bracket 62, to allow each second shield plate 66 to locate at an outer side of the end plate 624. The through holes 666 of each second shield plate 66 align with the shaft holes 6245 of the end plate 624. The shafts 69 extend through the shaft holes 6245 and the through holes 666, to connect the second shield plates 66 to the end plates 624 on a rotatable basis. The resilient pieces 6246 abut outer surfaces of the second position plates 663. The second shield plates 66 are substantially perpendicular to the support plate 622. The first shield plate 64 can slide relative to the bracket 62 along the slide slots 644, and the second shield plates 66 can be rotated about the shafts 69.

Figure 4:
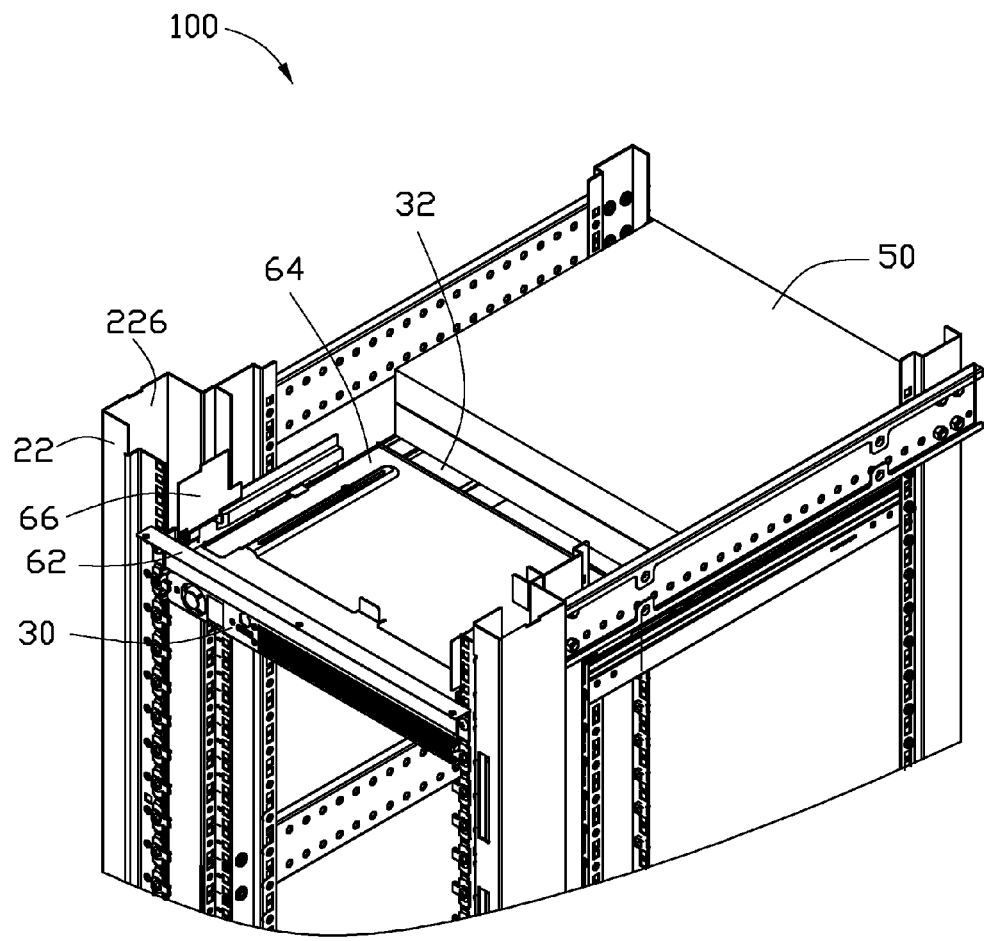
FIG. 4 is an assembled, isometric view of the server cabinet of FIG. 1.

Referring to FIG. 4, in assembly of the shield apparatus 60 to the rack 20, the bracket 62 is inserted into the rack 20 from the rear end of the rack 20. The guiding blocks 227 of the support poles 22 are slidably received in the slide slots 6242. The bracket 62 is inserted further, until the second shield plates 66 face the spaces 226. Two screws extend through the through holes 6254 of the fastening plate 625, to be screwed into the screw holes 228 of the support poles 22. The shield apparatus 60 is thus mounted at a rear end of the top of the opening 32.

Figure 5:
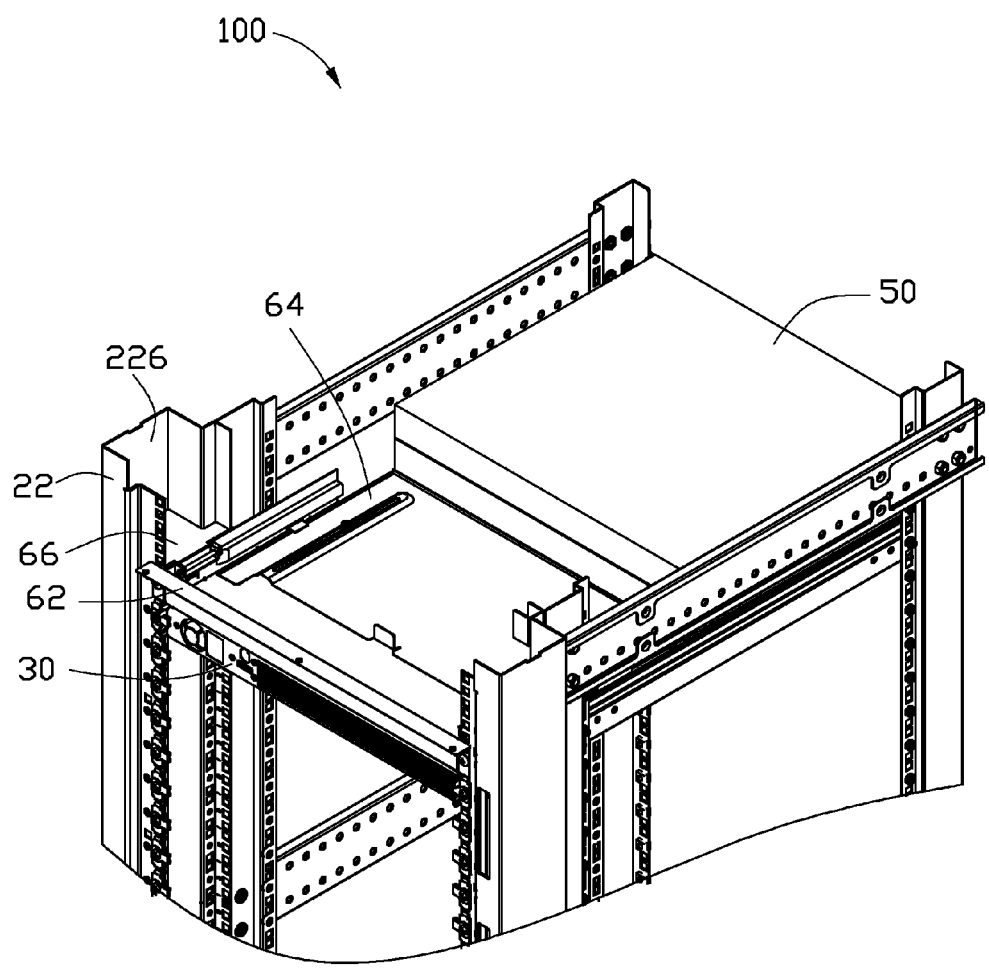
FIG. 5 is similar to FIG. 4, but shows a server cabinet in use.

Referring to FIG. 5, in use, the operation piece 646 is utilized to move the first shield plate 64 toward the switch 50 along the slide slots 644, until the first shield plate 64 abuts with the switch 50. The first shield plate 64 and the support plate 622 cooperatively shield the opening 32 of the server 30. The screws 67 are tightened to lock and fix the first shield plate 64. The second shield plates 66 are rotated into the spaces 226, thus deforming the resilient pieces 6246, until the second shield plates 66 block and seal the spaces 226. The resilient pieces 6246 restore to abut the outer surfaces the first position plates 661. When the heat-dissipating airflow from the fans enters the server 30, the airflow is restricted to moving through the server 30, and will not flow out of the server 30 through the opening 32 and/or the spaces 226.

It is to be understood, however, that even though numerous characteristics and advantages of certain embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A server cabinet, comprising:
   a rack;
   a server installed in the rack and defining an opening in a top of the server; and
   a shield apparatus comprising a bracket mounted in the rack and located above the server, and
   a first shield plate movably mounted to the bracket for shielding or exposing the opening of the server;
   wherein the bracket comprises
   a rectangular support plate,
   two end plates extending up from two opposite ends of the support plate, and
   a fastening plate extending up from a first side of the support plate,
   the fastening plate is fastened to the rack,
   a protrusion protrudes up from a second side of the support plate opposite to the fastening plate,
   a guiding rail protrudes up from the first shield plate and extends in a direction from the first side to the second side of the first shield plate, the protrusion is slidably received in the guiding rail.

2. The server cabinet of claim 1, wherein the protrusion defines
   a screw hole, a top surface of the guiding rail defines a slide slot extending along a lengthwise direction of the guiding rail, a screw extends through the slide slot to screw in the screw hole.

3. The server cabinet of claim 1, wherein
   a position piece parallel to the support plate extends in from each end plate, the position piece and the support plate cooperatively bound a guiding slot, a corresponding end of the shield first plate is slidably received in the guiding slot.

4. The server cabinet of claim 1, wherein the rack comprises
   four support poles respectively located at four corners of the rack, the fastening plate of the bracket is installed to two support poles locating at a rear end of the rack.

5. The server cabinet of claim 4, wherein each support pole located at the rear end of the rack defines a space facing the other support pole located at the rear end of the rack, the shield apparatus further comprises two second shield plates respectively and rotatably connected to the end plates of the bracket, to shield or expose the corresponding spaces.

6. The server cabinet of claim 5, wherein each end plate defines a cutout, two tabs extend in from opposite sidewalls bounding the cutout, each tab defines a shaft hole, each second shield plate comprises an extending portion, each extending portion defines a through hole, a shaft rotatably extends through the shaft holes of the tabs of each end plate and the through hole of the extending portion.

7. The server cabinet of claim 6, wherein the extending portion comprises a first position plate perpendicularly extending down from the second shield plate, a second position plate perpendicularly extending from a distal side of the first position plate away from the second shield plate, and two connecting pieces extending from two ends of the first position plate and connected to the second position plate, a resilient piece extends up from a bottom wall bounding the cutout of each end plate for abutting either an outer surface of the first position plate or an outer surface of the second position plate, the through hole is defined in the connecting plates.

8. The server cabinet of claim 1, further comprising a switch mounted on a front end of the rack and located above the server.

* * * * *